United States Patent [19]

Haas et al.

[11] Patent Number: 5,862,236
[45] Date of Patent: Jan. 19, 1999

[54] METHOD AND APPARATUS FOR CONTROLLING VOLUME OF A SPEAKER

[76] Inventors: Kenneth Alan Haas, 224-D Chesterfield Ct., Schaumburg, Ill. 60193; Kevin L. Haas, 585 Newark La., Hoffman Estates, Ill. 60194

[21] Appl. No.: 611,456

[22] Filed: Mar. 22, 1996

[51] Int. Cl.⁶ .................................................. H03G 3/00
[52] U.S. Cl. ............................................................ 381/107
[58] Field of Search ............................................ 381/104, 107, 381/103

[56] References Cited

U.S. PATENT DOCUMENTS

| | | |
|---|---|---|
| 3,873,921 | 3/1975 | Petrinec . |
| 4,792,990 | 12/1988 | Beyers, Jr. .................... 381/107 |
| 5,029,005 | 7/1991 | Morris . |
| 5,369,440 | 11/1994 | Sussman . |
| 5,502,771 | 3/1996 | Rhodes et al. ................ 381/104 |
| 5,528,316 | 6/1996 | Lee ................................ 348/725 |
| 5,566,237 | 10/1996 | Dobbs et al. .................. 381/103 |

*Primary Examiner*—Forester W. Isen

[57] ABSTRACT

Apparatus (100) for controlling the volume of a speaker (109) by restricting the volume level of the speaker (109) at power on. The apparatus (100) includes a microprocessor controller (103) for operating the speaker (109) at a first volume level prior to powering off. Upon power on, the microprocessor controller (103) determines a statistic based on a time of the received power-on command, and restricts the volume level of the speaker (109) based on the statistic.

18 Claims, 5 Drawing Sheets

METHOD AND APPARATUS FOR CONTROLLING VOLUME OF A SPEAKER

FIELD OF THE INVENTION

The present invention relates generally to controlling the volume of a speaker and, in particular, to restricting the volume of a speaker during certain time periods.

BACKGROUND OF THE INVENTION

Receivers are known to comprise volume-control circuits. In particular, the volume of a speaker within many receivers may varied by the pushing of a volume-control button. An instance where volume-control circuits are particularly useful is when a receiver is placed into operation having a speaker volume at a disturbing level. For example, when a receiver is placed into operation during a morning hour, the speaker may be functioning at a volume level that is disturbing to sleeping individuals. In many instances the operator can push a volume-control button to reduce the volume level of the speaker, but it may take a substantial period of time for the speaker to reach an acceptable volume level.

Thus a need exists for a method and apparatus for volume control that mitigates situations where speaker volume operates at excessive levels.

DETAILED DESCRIPTION OF THE DRAWINGS

Figure 1:
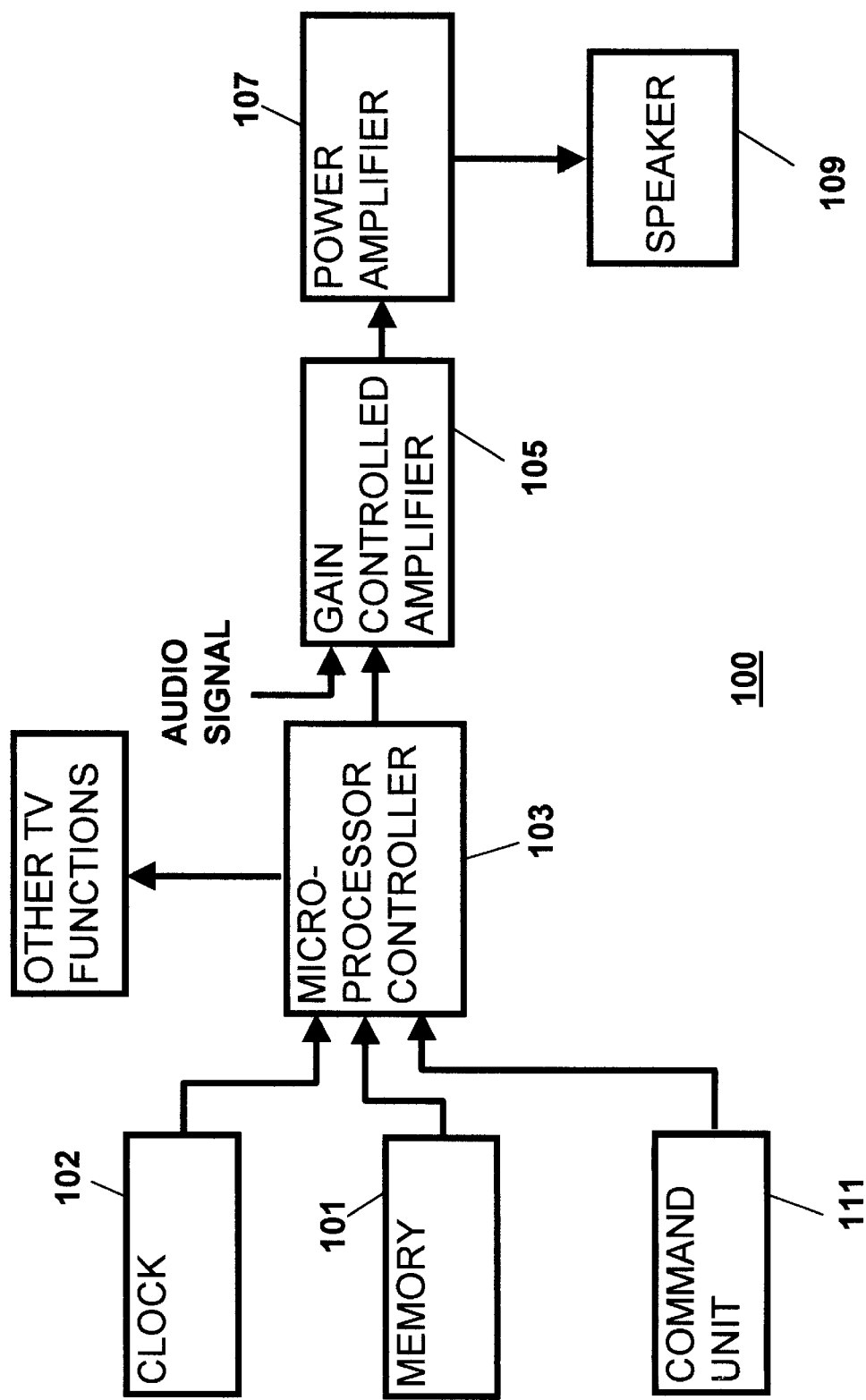
FIG. 1 illustrates an apparatus for controlling volume in accordance with a preferred embodiment of the present invention.

The present invention mitigates situations where speaker volume operates at excessive levels by providing a method and apparatus for controlling the volume of a speaker by restricting the volume level of the speaker at power on. The apparatus includes a microprocessor controller for operating the speaker at a first volume level prior to powering off. Upon power on, the microprocessor controller determines a statistic based on a time of the received power-on command, and restricts the volume level of the speaker based on the statistic.

Generally, the present invention encompasses a method of controlling a volume of a speaker. The method comprises the steps of operating the speaker at a first volume level and receiving a power-off command. A power on command is received and a statistic is determined based on a time of the received power-on command. The speaker is then operated at a second volume level based on the statistic.

An alternate embodiment encompasses a method of controlling a volume of a speaker, the speaker capable of operating at a highest level and a lowest level. The method comprises the steps of operating the speaker at a first volume, the first volume being at a level between the highest and the lowest level, receiving a volume-up command and determining a statistic based on a time of the received volume-up command. The speaker is operated at the first volume based on the statistic.

An alternate embodiment encompasses an apparatus for controlling a volume of a speaker. The apparatus comprises a speaker, an amplifier coupled to the speaker, a clock coupled to the amplifier, a memory coupled to the clock, a command unit coupled to the clock, and a microprocessor controller responsive to the command unit, the microprocessor controller operates the speaker at a first volume level, receives a power-off command from the command unit, receives a power-on command from the command unit, determines a statistic based on a time of the received power-on command, and operates the speaker at a second volume level based on the statistic.

An alternate embodiment encompasses an apparatus for controlling a volume of a speaker. The apparatus comprises a speaker capable of operating at a highest level and a lowest level, an amplifier coupled to the speaker, a clock coupled to the amplifier, a memory coupled to the clock, a command unit coupled to the clock, and a microprocessor controller responsive to the command unit. The microprocessor controller operates the speaker at a first volume between the highest and the lowest level, receives a volume-up command from the command unit, determines a statistic based on a time of the received volume-up command, and continues to operate the speaker at the first volume based on the statistic.

An alternate embodiment encompasses a method of controlling a volume of a speaker. The method comprises the steps of operating the speaker at a first volume level and determining a restricted time period. Next, a current time is determined and the speaker is operated at a second volume level based on the restricted time period and the current time, the second volume level lower than the first volume level.

An alternate embodiment encompasses an apparatus for controlling a volume of a speaker. The apparatus comprises a speaker, an amplifier coupled to the speaker, a clock coupled to the amplifier, a memory coupled to the clock, a command unit coupled to the clock, and a microprocessor controller responsive to the command unit. The microprocessor controller operates the speaker at a first volume level, determines a restricted time period, determines a current time, and operates the speaker at a second volume level, the second volume level based on the restricted time period and the current time, the second volume level lower than the first volume level.

FIG. 1 illustrates an apparatus 100 for controlling the volume of a speaker in accordance with a preferred embodiment of the present invention. In the preferred embodiment, the apparatus is incorporated in a television receiver, but may be incorporated in other devices (stereo receivers, or alarm clocks for example). The apparatus 100 comprises clock 102, memory 101, command unit 111, microprocessor controller 103, gain controlled amplifier 105, power amplifier 107, and speaker 109. Microprocessor controller 103 has an input signal originating from command unit 111 and from clock 102. Command unit 111 may be a front panel of the television receiver or a wireless infra-red remote control. Additionally, memory 101 is suitably coupled to microprocessor controller 103. Gain controlled amplifier 105 (such as a M50573 stereo processing IC available from Mitsubishi Corporation of Japan) having an audio input signal, is suitably coupled to the microprocessor controller 103.

Power amplifier 107 (such as a μPC 1188 audio power amplifier IC available from NEC Corporation of Japan) is suitably coupled to the gain controlled amplifier 105, with speaker 109 coupled to power amplifier 107.

Operation of the apparatus 100 occurs as follows: During receiver operation, microprocessor controller 103 receives a power-command signal from command unit 111. (in the case of alarm clock operation, the power-command signal may be a command signal instructing the alarm clock to execute an alarm). Although command unit 111 is capable of supplying microprocessor controller 103 a multitude of receiver-command signals for operation of other functions, for the purposes of this description, only power-command signals are discussed. Microprocessor controller 103, in response to the power-command signal (which may be a power-on or power-off command), switches the receiver "on" or "off ". Additionally, microprocessor controller 103 outputs a DC volume-control signal to gain controlled amplifier 105. Gain control amplifier 105 adjusts the gain of the audio signal in response to the DC voltage of the volume-control signal. Gain controlled amplifier 105 outputs an adjusted audio signal to power amplifier 107, which amplifies the adjusted audio signal and outputs the amplified signal to speaker 109. The volume of speaker 109 is proportional to the DC voltage of the volume-control signal. It will be appreciated that in a television receiver capable of stereophonic sound reproduction, the arrangement shown in FIG. 1 is used twice, once for each of the left and right audio signals.

Figure 2:
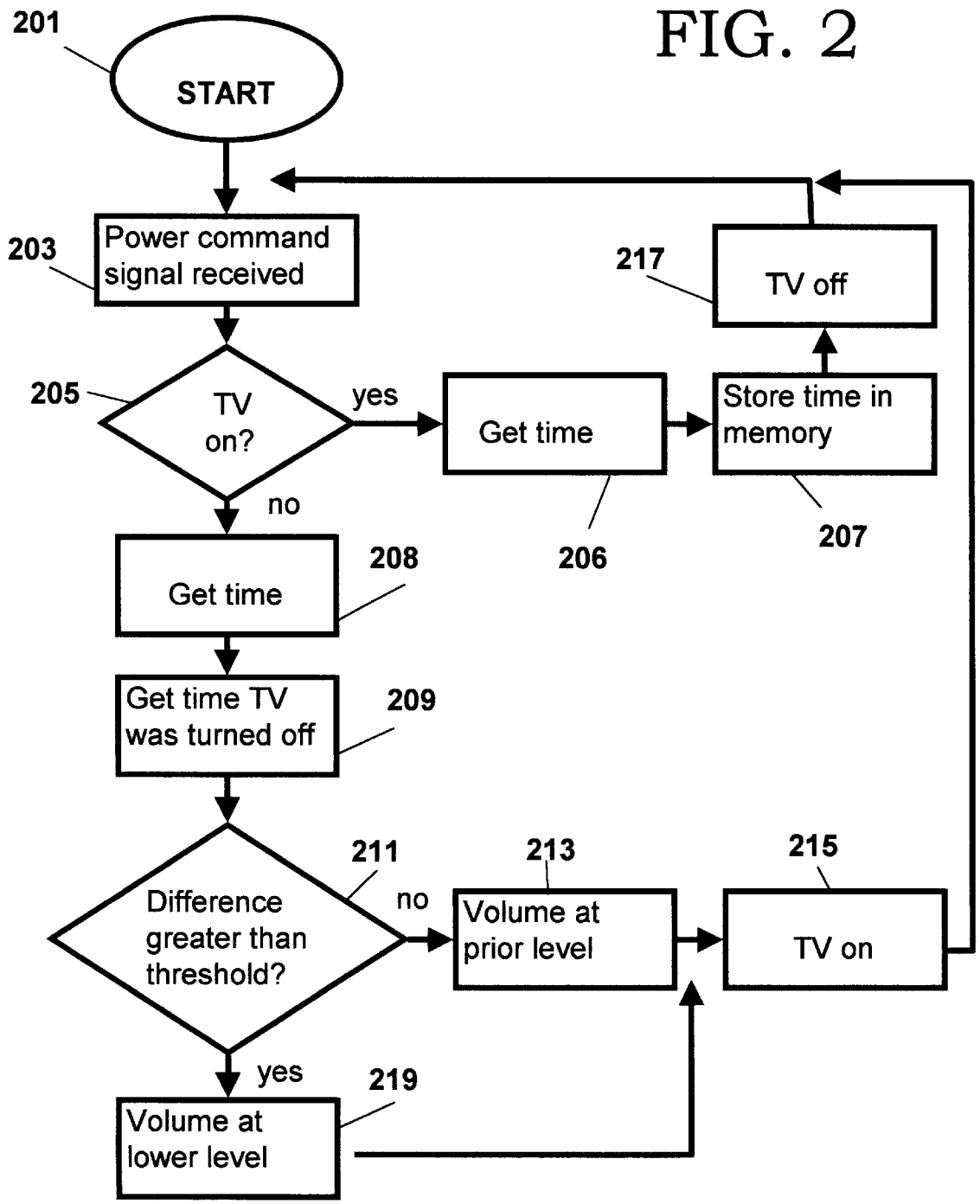
FIG. 2 illustrates a flow chart for controlling volume in accordance with a preferred embodiment of the present invention.

FIG. 2 illustrates a flow chart for controlling volume in accordance with a preferred embodiment of the present invention. In this embodiment, speaker 109 volume level upon receiver power on is restricted to a low level after the receiver has been in an "off" state for a predetermined amount of time, and is operated at a volume substantially equal to the volume at power off during a second predetermined amount of time. The logic flow begins at step 201. At step 203 a power-command signal is received by the microprocessor controller 103. Next, at step 205, the microprocessor controller 103 determines if the receiver is currently in an "on" state, and if so, accesses clock 102 and receives a current time (at step 206), stores the current time in a memory 101 (at step 207) and turns the receiver to an "off" state (at step 217). The logic flow then returns to step 203.

If, at step 205, the microprocessor controller 103 determines that receiver is not in an "on" state, then at step 208 the microprocessor controller accesses clock 102 and receives a current time. Next, at step 209, microprocessor controller 103 accesses memory 101 and retrieves a time that the receiver was last placed in the "off" state (last time receiver was operated). Next, at step 211, the microprocessor controller 103 determines if a difference between the current time and the time that the receiver was last placed in the "off" state is greater than a threshold. In a preferred embodiment, the threshold is equal to 5 hours. Because there exists situations in which the receiver may be in the "off" state for more than 24 hours, in a preferred embodiment all time values include a date in which the time event occurred.

If, at step 211, it is determined that the difference between the current time (time of power-command signal) and the time that the receiver was last placed in an "off" state is not greater than the threshold, then at step 213, the microprocessor controller 103 returns the speaker 109 volume level to an amount substantially equal to the last operated speaker 109 volume level and the receiver is then placed in an "on" state (at step 215). The logic flow then returns to step 203. If, at step 211, it is determined that the difference between the current time and the time that the receiver was last placed in an "off" state is greater than a threshold, then at step 219, the microprocessor controller 103 reduces the speaker 109 volume to a predetermined amount and the receiver is placed in an "on" state (at step 215). In a preferred embodiment, the speaker 109 is placed in a low-volume state at power on and the speaker remains at a low-volume state until an appropriate volume-control command is received by microprocessor controller 103. The logic flow then continues to step 203. By powering up the receiver with speaker 109 in a low-volume state after the receiver has been in an "off" state for a predetermined amount of time, the situation where the receiver is turned on having an unacceptable speaker 109 volume level is mitigated.

Figure 3:
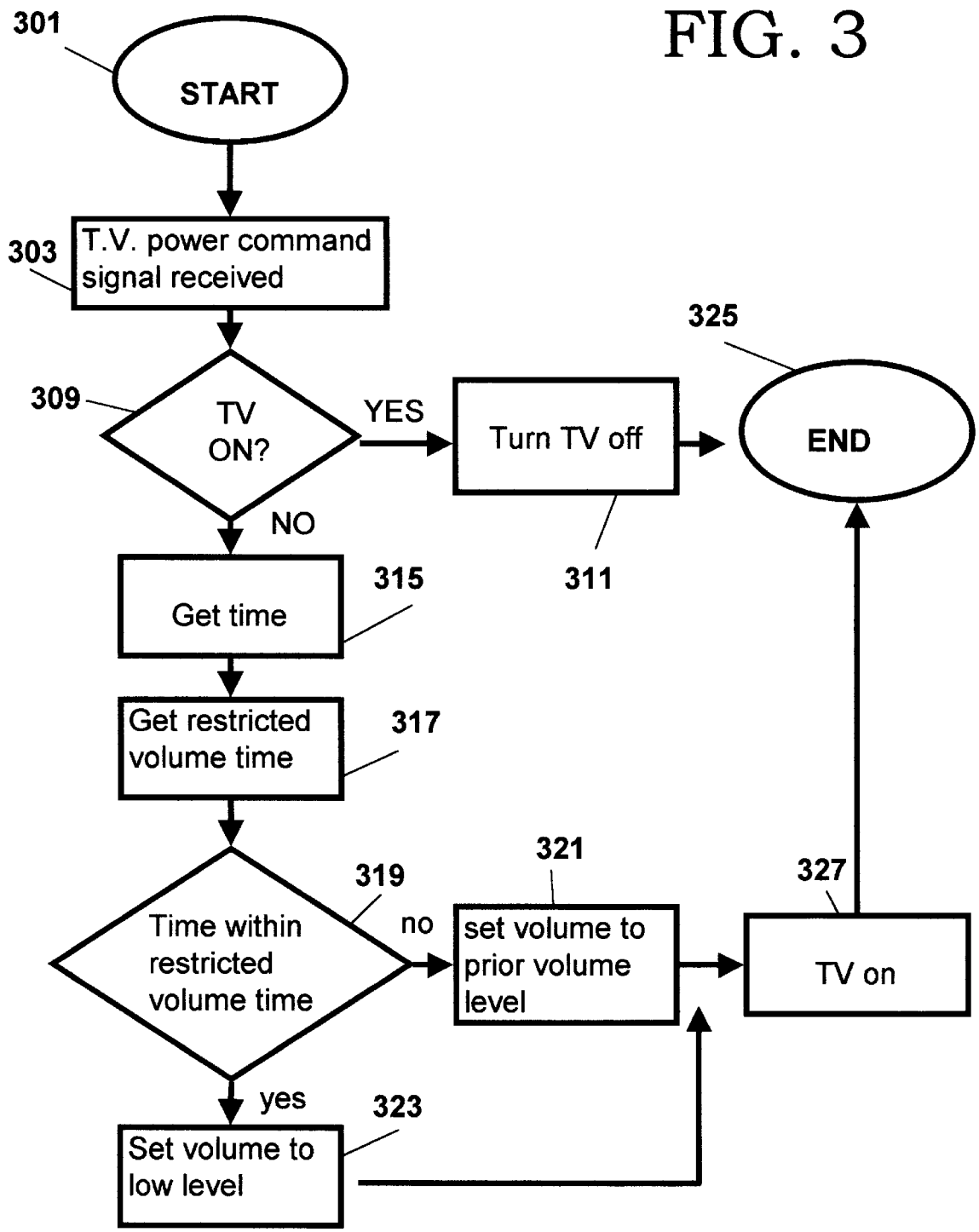
FIG. 3 illustrates a flow chart for controlling volume in accordance with an alternate embodiment of the present invention.

FIG. 3 illustrates a flow chart for controlling volume in accordance with an alternate embodiment of the present invention. In this embodiment speaker 109 volume level upon receiver power on is at a low level during restricted intervals of time. The logic flow begins at step 301. At step 303 the microprocessor controller 103 receives a power-command signal. At step 309, the microprocessor controller 103 determines if the receiver is currently in an "on" state, and if so, the microprocessor controller places the receiver in an "off" state (step 311). The logic flow then ends at step 325. If, at step 309, it is determined that the receiver is not in an "on" state, then at step 315 the microprocessor controller 103 accesses clock 102 and obtains the current time. Next, at step 317, the microprocessor controller 103 accesses memory 101 to receive a restricted interval of time. In a preferred embodiment, the restricted interval of time is any time interval in which an operator does not want the receiver placed in an "on" state with speaker 109 volume having an excessive level. For example, an operator might chose a restricted interval of time during normal sleeping hours. In a preferred embodiment, the restricted interval of time is input into memory 101 by the operator. This allows specific tailoring of low speaker 109 volume levels during power-up.

Continuing, at step 319 the microprocessor controller 103 determines if the current time (related to the time of the power-command signal) is within the restricted interval of time, and if not, speaker 109 volume level is set to an amount substantially equal to the last operated speaker 109 volume level (at step 321) and the receiver is then placed in the "on" state (at step 327). The logic flow then ends at step 325. If at step 319 the microprocessor controller 103 determines that the current time is within the restricted interval of time, then at step 323, speaker 109 volume is set to a predetermined level (at step 323) and the receiver is then placed in an "on" state (at step 313). In a preferred embodiment, speaker 109 is placed in a low-volume state at power on and the speaker remains at a low-volume state until an appropriate volume-control command is received by microprocessor controller 103. The logic flow then ends at step 325. By restricting the power-up speaker 109 volume level to a low-volume level during restricted intervals of time, the situation where the receiver is turned on having an unacceptable speaker 109 volume level is mitigated.

Figure 4:
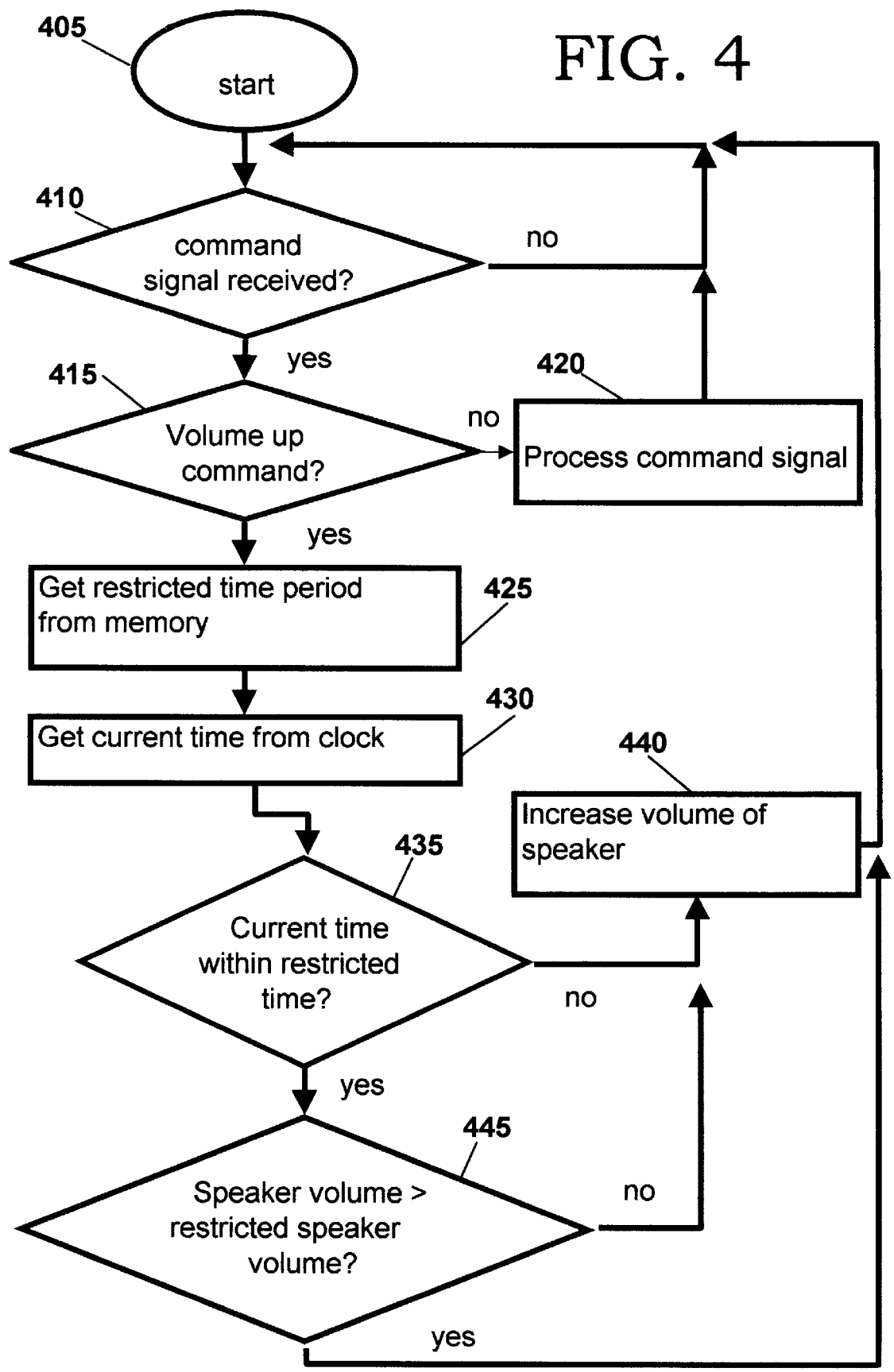
FIG. 4 illustrates a flow chart for controlling volume in accordance with a second alternate embodiment of the present invention.

FIG. 4 illustrates a flow chart for controlling volume in accordance with a second alternate embodiment of the present invention. In this embodiment, the maximum volume that speaker 109 can transmit is limited during restricted intervals of time. The logic flow starts at 405 where the receiver is operating in an "on" state with a speaker volume level between a highest and a lowest volume level. At step 410 microprocessor controller 103 determines if a command signal was received. If at step 410 the microprocessor controller 103 determines that no command signal was received, then the logic flow returns to step 410, otherwise the logic flow continues to step 415 where the microprocessor controller 103 determines if a volume-up command was received. If at step 415, the microprocessor controller 103 determines that no volume-up command was received, then at step 420 the microprocessor controller 103 continues processing the command signal and the logic flow returns to step 410.

Continuing, if at step 415 the microprocessor controller 103 determines that the received command was a volume-up command, then at step 425 the microprocessor controller 103 accesses memory 101 to get a restricted time period. In a preferred embodiment, the restricted time period is a period of time in which a user does not want speaker 109 to operate at excessive volume levels. Next, at step 430 the microprocessor controller 103 accesses clock 102 and retrieves a current time. At step 435 the microprocessor controller 103 determines if the current time is within the restricted time period, and if not, at step 440 the microprocessor controller 103 increases the volume of the speaker 109. The logic flow continues to step 410. If at step 435 the microprocessor controller 103 determines that the current time is within the restricted time period, then at step 445 the microprocessor controller determines if the current speaker 109 volume is greater than or equal to a restricted speaker 109 volume, and if not, the logic flow continues to step 440 where the microprocessor controller 103 increases the volume of the speaker 109. In a preferred embodiment, the step of determining if the current speaker 109 volume is greater than or equal to a restricted speaker 109 volume is accomplished by the microprocessor controller 103 checking the current DC voltage of the volume-control signal against a threshold DC voltage.

Continuing, If at step 445 the microprocessor controller 103 determines that the current speaker 109 volume is greater than or equal to the restricted speaker 109 volume, then no increase in speaker 109 volume takes place and the logic flow returns to step 410. By limiting the volume level that speaker 109 can transmit during restricted periods of time, the situation in which the speaker 109 transmits at excessive volume levels is mitigated.

Figure 5:
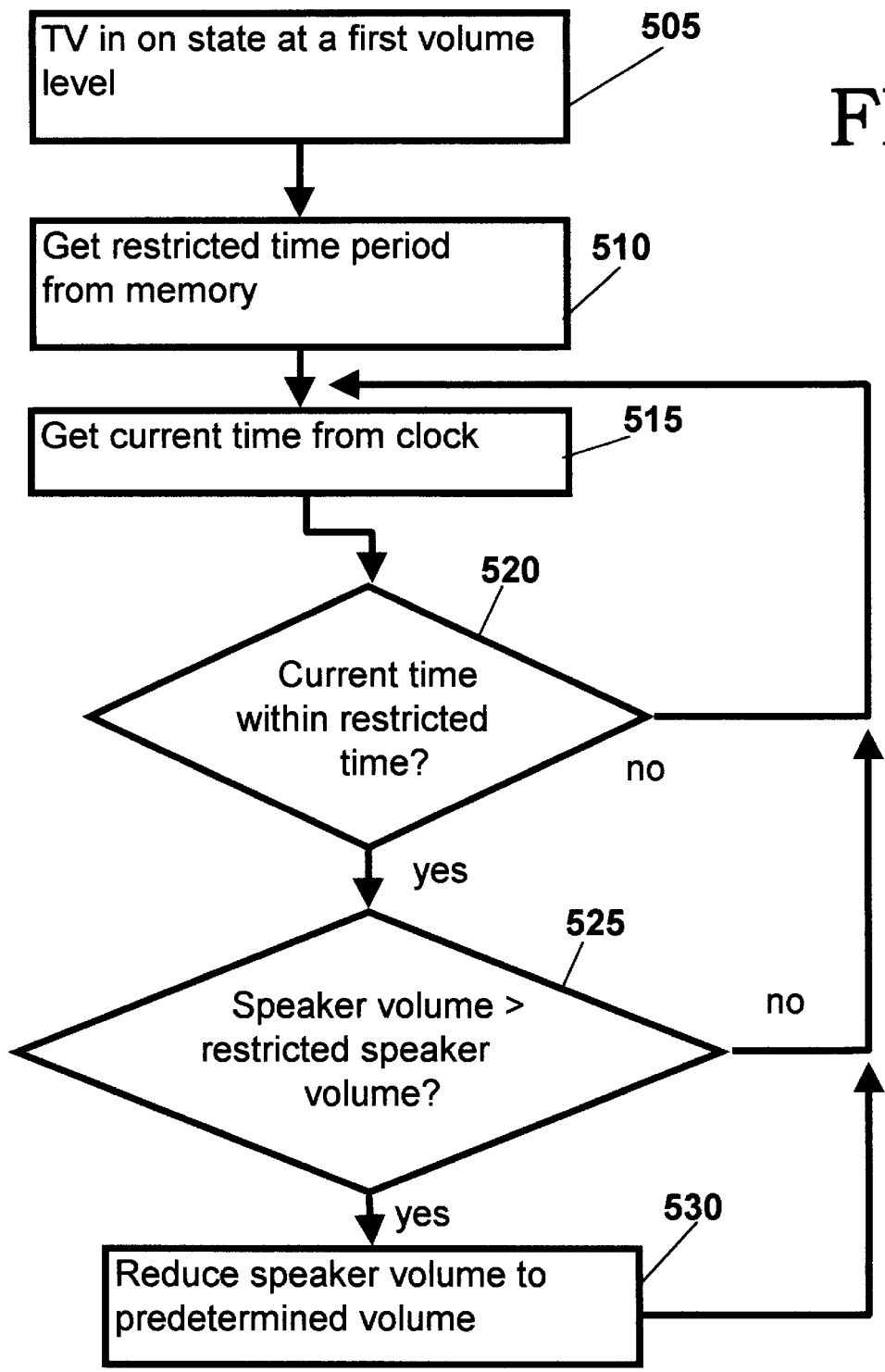
FIG. 5 illustrates a flow chart for controlling volume in accordance with a third alternate embodiment of the present invention.

FIG. 5 illustrates a flow chart for controlling volume in accordance with a third alternate embodiment of the present invention. The logic flow starts at step 505 where the television receiver is in an "on" state and operating at a first volume level. Next at step 510 the microprocessor controller 103 accesses memory 101 to get a restricted time period. In a preferred embodiment, the restricted time period is a period of time in which a user does not want speaker 109 to operate at excessive volume levels. Next, at step 515 the microprocessor controller 103 accesses clock 102 and retrieves a current time. At step 520 the microprocessor controller 103 determines if the current time is within the restricted time period, and if not, the logic flow continues to step 515.

If at step 520 the microprocessor controller 103 determines that the current time is within the restricted time period, then at step 525 the microprocessor controller 103 determines if the current speaker 109 volume is greater than or equal to a restricted speaker 109 volume, and if not, the logic flow continues to step 515. If, at step 525, the microprocessor controller 103 determines that the current speaker 109 volume is greater than or equal to the restricted speaker 109 volume, then at step 530, the speaker 109 volume level is reduced to a predetermined volume. In a preferred embodiment, the speaker volume is reduced to a non-disturbing level. The logic flow then continues to step 515.

The descriptions of the invention, the specific details, and the drawings mentioned above, are not meant to limit the scope of the present invention. For example, in addition to user supplied restricted periods of time, a user may supply restricted speaker volume levels. It is the intent of the inventors that various modifications can be made to the present invention without varying from the spirit and scope of the invention, and it is intended that all such modifications come within the scope of the following claims.

What is claimed is:

1. A method of controlling a volume of a speaker, the method comprising the steps of:

operating the speaker at a first volume level;

receiving a power-off command;

receiving a power-on command;

determining a time interval, the time interval being related to a difference in time between a last time the speaker was operated and a time of the received power-on command;

comparing the time interval to a threshold; and operating the speaker at a second volume level based on the comparison.

2. The method of claim 1 wherein the step of determining a statistic comprises the steps of:

determining a restricted interval of time;

comparing the time of the received power-on command with the restricted interval of time; and determining a statistic based on the comparison.

3. The method of claim 1 wherein the speaker is coupled to a television receiver.

4. The method of claim 1 wherein the speaker is coupled to a stereo receiver.

5. The method of claim 1 wherein the second volume level is lower than the first volume level.

6. The method of claim 1 wherein the speaker is coupled to an alarm clock.

7. A method of controlling a volume of a speaker, said speaker capable of operating at a highest level and a lowest level, the method comprising the steps of:

operating the speaker at a first volume, said first volume at a level between the highest and the lowest level;

receiving a volume-up command;

determining a statistic based on a time of the received volume-up command; and operating the speaker at no higher than the first volume based on the statistic.

8. The method of claim 7 wherein the step of determining a statistic comprises the steps of:

determining a restricted interval of time;

comparing the time of the received volume-up command with the restricted interval of time; and determining a statistic based on the comparison.

9. The method of claim 7 wherein the speaker is coupled to a television receiver.

10. The method of claim 7 wherein the speaker is coupled to a stereo receiver.

11. The method of claim 7 wherein the speaker is coupled to an alarm clock.

12. An apparatus for controlling a volume, the apparatus comprising:

a speaker;

an amplifier coupled to the speaker;

a clock coupled to the amplifier;

a memory coupled to the clock;

a command unit coupled to the clock; and a microprocessor controller responsive to the command unit, said microprocessor controller operating the speaker at a first volume level, receiving a power-off command from the command unit, receiving a power-on command from the command unit, determining a time interval, the time interval being related to a difference in time between a last time the speaker was operated and a time of the received power-on command, comparing the time interval to a threshold, and operating the speaker at a second volume level based on the statistic.

13. The apparatus of claim 12 wherein the microprocessor controller determines the statistic by determining a restricted interval of time, comparing the time of the received power-on command with the restricted interval of time, and determining a statistic based on the comparison.

14. The apparatus of claim 12 wherein the apparatus is coupled to a television receiver.

15. The apparatus of claim 12 wherein the apparatus is coupled to a stereo receiver.

16. An apparatus for controlling a volume, the apparatus comprising:

a speaker, said speaker capable of operating at a highest level and a lowest level;

an amplifier coupled to the speaker;

a clock coupled to the amplifier;

a memory coupled to the clock;

a command unit coupled to the clock; and a microprocessor controller responsive to the command unit, said microprocessor controller operating the speaker at a first volume, said first volume at a level between the highest and the lowest level, said microprocessor controller receiving a volume-up command from the command unit, determining a statistic based on a time of the received volume-up command, and continuing to operate the speaker at no higher than the first volume based on the statistic.

17. The apparatus of claim 16 wherein the microprocessor controller determines the statistic by determining a restricted interval of time, comparing the time of the received volume-up command with the restricted interval of time, and determining a statistic based on the comparison.

18. The apparatus of claim 16 wherein the speaker is coupled to a stereo receiver.

* * * * *